United States Patent
Yamada et al.

(10) Patent No.: US 7,805,641 B2
(45) Date of Patent: Sep. 28, 2010

(54) TEST APPARATUS FOR REGULATING A TEST SIGNAL SUPPLIED TO A DEVICE UNDER TEST AND METHOD THEREOF

(75) Inventors: Tatsuya Yamada, Tokyo (JP); Masaru Doi, Tokyo (JP); Shinya Satou, Tokyo (JP)

(73) Assignee: Advantest Corporation, Tokyo (JP)

( * ) Notice: Subject to any disclaimer, the term of this patent is extended or adjusted under 35 U.S.C. 154(b) by 932 days.

(21) Appl. No.: 11/651,948

(22) Filed: Jan. 10, 2007

(65) Prior Publication Data

US 2007/0266290 A1   Nov. 15, 2007

Related U.S. Application Data

(63) Continuation of application No. PCT/JP2006/325963, filed on Dec. 26, 2006.

(30) Foreign Application Priority Data

Dec. 28, 2005  (JP)  ............................. 2005-378716

(51) Int. Cl.
  *G11B 5/00*  (2006.01)
(52) U.S. Cl. ................. 714/700; 714/742; 324/527; 324/537; 324/755; 324/763; 324/765; 702/72
(58) Field of Classification Search ............... 714/700, 714/742; 324/527, 537, 755, 763, 765; 702/72
  See application file for complete search history.

(56) References Cited

U.S. PATENT DOCUMENTS 5,764,598 A * 6/1998 Okayasu ...................... 368/120
6,282,680 B1 * 8/2001 Takagi et al. ................. 714/724
6,812,727 B2 * 11/2004 Kobayashi ................... 324/765
6,820,234 B2 * 11/2004 Deas et al. .................... 714/814

(Continued)

FOREIGN PATENT DOCUMENTS

DE   102 97 437 T5   12/2004

(Continued)

OTHER PUBLICATIONS

Patent Abstracts of Japan, Publication No. 06-188635, Publication Date: Jul. 8, 1994, 2 pages.

(Continued)

*Primary Examiner*—Esaw T Abraham
(74) *Attorney, Agent, or Firm*—Osha • Liang LLP

(57) ABSTRACT

A test apparatus tests a device under test. The test apparatus includes a period generator that generates a rate signal determining a test period according to an operating period of the device under test, a phase comparing section that inputs an operational clock signal for the device under test generated from the device under test and detects a phase difference between the operational clock signal and the rate signal using the rate signal as a standard, a test signal generating section that generates a test signal to be supplied to the device under test in synchronization with the rate signal, a delaying section that delays the test signal in accordance with the phase difference to substantially synchronize the delayed signal with the operational clock signal, and a test signal supplying section that supplies the delayed test signal to the device under test.

20 Claims, 11 Drawing Sheets

U.S. PATENT DOCUMENTS

| | | | |
|---|---|---|---|
| 6,876,219 B2 * | 4/2005 | Vollrath | 324/765 |
| 6,885,209 B2 * | 4/2005 | Mak et al. | 324/763 |
| 7,126,366 B2 | 10/2006 | Ohashi et al. | |
| 7,363,563 B1 * | 4/2008 | Hissen et al. | 714/733 |
| 7,656,181 B2 * | 2/2010 | Kim et al. | 324/765 |
| 2005/0231227 A1 | 10/2005 | Ohashi et al. | |

FOREIGN PATENT DOCUMENTS

| | | |
|---|---|---|
| DE | 103 93 445 T5 | 8/2005 |
| JP | 6-188635 | 7/1994 |
| JP | 6-242185 | 9/1994 |
| JP | 7-306243 | 11/1995 |
| JP | 3414841 | 4/2003 |
| JP | 2003-149305 | 5/2003 |
| KR | 10-2005-0007601 | 1/2005 |
| WO | WO-03/104826 | 12/2003 |

OTHER PUBLICATIONS

Patent Abstracts of Japan, Publication No. 2003-149305, Publication Date: May 21, 2003, 2 pages.
Office Action for German Application No. 11 2006 003 595.9-35 mailed on Dec. 23, 2009 and English translation thereof, 32 pages.
International Search Report issued in International Application No. PCT/JP2006/325963 mailed on Apr. 3, 2007 and partial English translation thereof, 9 pages.

* cited by examiner

```
LP1:  IDXI #200                    ;EMPTY LOOP UNTIL OPERATIONAL CLOCK SIGNAL OF DUT IS STABLE
      NOP                          ;COMPARE WAVEFORMS (EXPECTED VALUE H OF DQS, EXPECTED VALUE X OF DQ)
      IDXI #100                    ;PUT DUMMY CYCLES BY THE NUMBER OF STAGES OF PIPELINE
      If (!PASS) JMP LP1 /TM_INC   ;ADD TIMING SHIFT AMOUNT
                                   ;ESCAPE FROM LOOP IF EXPECTED VALUES IS IDENTICAL WITH EACH OTHER (IF EDGE IS FOUND)
      NOP                          ;FROM HERE TEST DATA IS STARTED
```

*FIG. 11*

TEST APPARATUS FOR REGULATING A TEST SIGNAL SUPPLIED TO A DEVICE UNDER TEST AND METHOD THEREOF

CROSS REFERENCE TO RELATED APPLICATION

This is a continuation application of PCT/JP2006/325963 filed on Dec. 26, 2006 which claims priority from a Japanese Patent Application(s) NO. 2005-378716 filed on Dec. 28, 2005, the contents of which are incorporated herein by reference.

BACKGROUND

1. Technical Field

The present invention relates to a test apparatus, a test method, and a program therefor. More particularly, the present invention relates to a test apparatus, a test method, and a program therefor for regulating a timing of a test signal to be supplied to a device under test.

2. Related Art

Conventionally, a test apparatus has input operational clock signals into a device under test, and has operated the device under test by means of the operational clock signals. That is to say, the operational clock signals are synchronized between the test apparatus and the device under test, and thus the test apparatus can supply test signals to the device under test based on the operational clock signals and can acquire output signals from the device under test based on the operational clock signals. In addition, there are the following Patent Documents as related prior art documents.

Japanese Patent Application Publication No. 1994-188635
Japanese Patent Application Publication No. 2003-149305

However, depending on a type of the device under test, the device under test generates operational clock signals by means of an independent oscillation circuit to operate independently of the test apparatus in some cases. Since operational clock signals are not synchronized between such a device under test and the test apparatus, the test apparatus cannot supply test signals to the device under test and also cannot acquire output signals from the device under test in some cases.

Moreover, when input signals input into the device under test include noises (so-called jitters) for a time component, phases of the input signals may be deviated independently of operating clocks of the device under test. In order to test admissibility for deviance of such a phase, the test apparatus has conventionally modulated test signals and input the signals into the device under test, and has tested whether the device under test operates normally. In order to realize this test, there has been conventionally used a method for setting a modifying amount of a phase for each cycle of the test signal. However, when frequency of jitter is low, since the type of modifying amounts of phase which are set for each cycle increases and thus a requirement amount of hardware resources such as a register becomes large, it is not realistic.

As a reference technique, a technique for shaping a signal waveform by means of controlling a divider with a value stored on a memory is proposed in Japanese Patent Application Publication No. 1994-188635. According to this technique, since it is preferable that the memory stores one period of data, it is possible to reduce a capacity of the memory required for waveform shaping. However, this document only shows one method for shaping a waveform and thus does not disclose how to synchronize signals by means of applying waveform shaping.

Therefore, it is an object of some aspects of the present invention to provide a test apparatus, a test method, and a program therefor which can solve the foregoing problems. The above and other objects can be achieved by combinations described in the independent claims. The dependent claims define further advantageous and exemplary combinations of the present invention.

SUMMARY

To achieve this object, according to the first aspect of the present invention, there is provided a test apparatus that tests a device under test. The test apparatus includes: a period generator that generates a rate signal determining a test period according to an operating period of the device under test; a phase comparing section that inputs an operational clock signal for the device under test generated from the device under test and detects a phase difference between the operational clock signal and the rate signal using the rate signal as a standard; a test signal generating section that generates a test signal to be supplied to the device under test in synchronization with the rate signal; a delaying section that delays the test signal in accordance with the phase difference to substantially synchronize the delayed signal with the operational clock signal; and a test signal supplying section that supplies the delayed test signal to the device under test.

The phase comparing section may include: a strobe generating section that generates strobe signals while sequentially changing a phase for the rate signal; a timing comparator that acquires the operational clock signal at a timing designated by each of the strobe signals; an edge detecting section that detects an edge of the operational clock signal based on a value of the operational clock signal at each timing; and a phase difference output section that outputs the phase difference based on a position of the edge of the operational clock signal for an edge of the rate signal.

The strobe generating section may generate the plurality of strobe signals for each of a first phase and a second phase for the rate signal, the timing comparator may acquire the operational clock signal at the plurality of timings designated by the plurality of strobe signals for each of the first phase and the second phase, and the edge detecting section may detect that the edge of the operational clock signal is between the first phase and the second phase on condition that, in case of the first phase, a ratio that the operational clock signal is a first logical value is not more than a ratio that the operational clock signal is a second logical value and, in case of the second phase, the ratio that the operational clock signal is the first logical value is not less than the ratio that the operational clock signal is the second logical value.

The strobe generating section may generate the predetermined number of the strobe signals for each of the first phase and the second phase for the rate signal, the timing comparator may acquire the operational clock signal at the plurality of timings designated by each of the strobe signals for each of the first phase and the second phase, the phase comparing section may further include a count section that counts the number of times by which the operational clock signal has been a predetermined logical value for each of the first phase and the second phase, and the edge detecting section may detect that the edge of the operational clock signal is between the first phase and the second phase on condition that, in case of the first phase, the counted number of times is not more than a preset threshold value and, in case of the second phase, the counted number of times is not less than the threshold value.

The strobe generating section may generate the predetermined number of the strobe signals for each of the phases while sequentially increasing or decreasing the phase, and the edge detecting section may detect that the edge of the operational clock signal is at a position substantially equal to that of the one phase according to the fact that the number of times counted by the count section for the one phase is not less than the threshold value.

The strobe generating section may further include: a modulation memory that stores an amount of modulation of the phase for the rate signal; and an address register that outputs an address to be provided to the modulation memory, and the strobe generating section may generate the strobe signal by which a phase for the rate signal is determined based on the modulation amount read from the modulation memory according to sequentially incrementing or decrementing the address.

Moreover, the phase difference output section may include a register that stores phase difference information showing the phase difference.

Moreover, the test apparatus may further include a control section that controls a test for the device under test by the test apparatus, the phase difference output section may inform the control section that the phase difference has been detected when detecting the phase difference, and the control section may read, in accordance with the notice of detection of the phase difference, the phase difference information stored on the register to set a delay amount of the delaying section and instruct the test signal generating section to generate the test signal for testing the device under test.

Moreover, the test signal generating section may start generating the test signal for testing the device under test on condition that the phase difference has been detected by the phase comparing section.

Moreover, the test apparatus may further include: a modulation memory that records a plurality of modulation amounts for the test signal; an address register that designates an address of the modulation memory; and a control section that sequentially changes an address value of the address register to make the modulation memory sequentially output the different modulation amounts, and the delaying section may add or subtract the modulation amount output from the modulation memory to or from the delay amount set in accordance with the phase difference in order to modulate the test signal.

According to the second aspect of the present invention, there is provided a test method for testing a device under test. The test method includes: generating a rate signal determining a test period according to an operating period of the device under test; inputting an operational clock signal for the device under test generated from the device under test and detecting a phase difference between the operational clock signal and the rate signal using the rate signal as a standard; generating a test signal to be supplied to the device under test in synchronization with the rate signal; delaying the test signal in accordance with the phase difference to substantially synchronize the delayed signal with the operational clock signal; and supplying the delayed test signal to the device under test.

According to the third aspect of the present invention, there is provided a program for a test apparatus that tests a device under test. The program makes the test apparatus function as: a period generator that generates a rate signal determining a test period according to an operating period of the device under test; a phase comparing section that inputs an operational clock signal for the device under test generated from the device under test and detects a phase difference between the operational clock signal and the rate signal using the rate signal as a standard; a test signal generating section that generates a test signal to be supplied to the device under test in synchronization with the rate signal; a delaying section that delays the test signal in accordance with the phase difference to substantially synchronize the delayed signal with the operational clock signal; and a test signal supplying section that supplies the delayed test signal to the device under test.

According to the fourth aspect of the present invention, there is provided a test apparatus that tests a device under test. The test apparatus includes: a period generator that generates a rate signal determining a test period according to an operating period of the device under test; a strobe generating section that generates a strobe signal having a relative phase set for the rate signal; a timing comparator that compares a phase of an output signal output from the device under test and a phase of the strobe signal; a driver section that generates a test signal to be supplied to the device under test to supply the test signal to the device under test; a driver timing generating section that controls a timing at which the driver section outputs the test signal to a driver timing having the relative phase set for the rate signal; and a control section that sequentially changes setting of a relative phase of the strobe signal for the rate signal and sequentially changes setting of a relative phase of the driver timing for the rate signal with the generally same change amount, until the timing comparator detects that the phase of the output signal and the phase of the strobe signal are substantially identical with each other.

According to the fifth aspect of the present invention, there is provided a test apparatus that tests a device under test. The test apparatus includes: a period generator that generates a rate signal determining a test period according to an operating period of the device under test; a first strobe generating section that generates a first strobe signal having a relative phase set for the rate signal; a first timing comparator that compares a phase of an operational clock signal of the device under test generated from the device under test and a phase of the first strobe signal; a second strobe generating section that generates a second strobe signal having a relative phase set for the rate signal; a second timing comparator that compares a phase of a data signal output from the device under test in accordance with a test signal to be input and a phase of the second strobe signal; and a control section that sequentially changes setting of a relative phase of the first strobe signal for the rate signal and sequentially changes setting of a relative phase of the second strobe signal for the rate signal with the generally same change amount, until the first timing comparator detects that the phase of the operational clock signal and the phase of the first strobe signal are substantially identical with each other.

According to the sixth aspect of the present invention, there is provided a program for a test apparatus that tests a device under test. The program makes the test apparatus function as: a period generator that generates a rate signal determining a test period according to an operating period of the device under test; a strobe generating section that generates a strobe signal having a relative phase set for the rate signal; a timing comparator that compares a phase of an output signal output from the device under test and a phase of the strobe signal; a driver section that generates a test signal to be supplied to the device under test to supply the test signal to the device under test; a driver timing generating section that controls a timing at which the driver section outputs the test signal to a driver timing having the relative phase set for the rate signal; and a control section that sequentially changes setting of a relative phase of the strobe signal for the rate signal and sequentially changes setting of a relative phase of the driver timing for the rate signal with the generally same change amount, until the timing comparator detects that the phase of the output signal and the phase of the strobe signal are substantially identical with each other.

According to the seventh aspect of the present invention, there is provided a program for a test apparatus that tests a device under test. The program makes the test apparatus function as: a period generator that generates a rate signal determining a test period according to an operating period of the device under test; a first strobe generating section that generates a first strobe signal having a relative phase set for the rate signal; a first timing comparator that compares a phase of an operational clock signal of the device under test generated from the device under test and a phase of the first strobe signal; a second strobe generating section that generates a second strobe signal having a relative phase set for the rate signal; a second timing comparator that compares a phase of a data signal output from the device under test in accordance with a test signal to be input and a phase of the second strobe signal; and a control section that sequentially changes setting of a relative phase of the first strobe signal for the rate signal and sequentially changes setting of a relative phase of the second strobe signal for the rate signal with the generally same change amount, until the first timing comparator detects that the phase of the operational clock signal and the phase of the first strobe signal are substantially identical with each other.

The summary does not necessarily describe all necessary features of the present invention. The present invention may also be a sub-combination of the features described above.

BRIEF DESCRIPTION OF THE DRAWINGS

FIG. 11 is a view exemplary showing an instruction group included in a program given to a control section 30.

DESCRIPTION OF EXEMPLARY EMBODIMENTS

The embodiments of the invention will now be described based on the preferred embodiments, which do not intend to limit the scope of the present invention, but just exemplify the invention. All of the features and the combinations thereof described in the embodiment are not necessarily essential to the invention.

Figure 1:
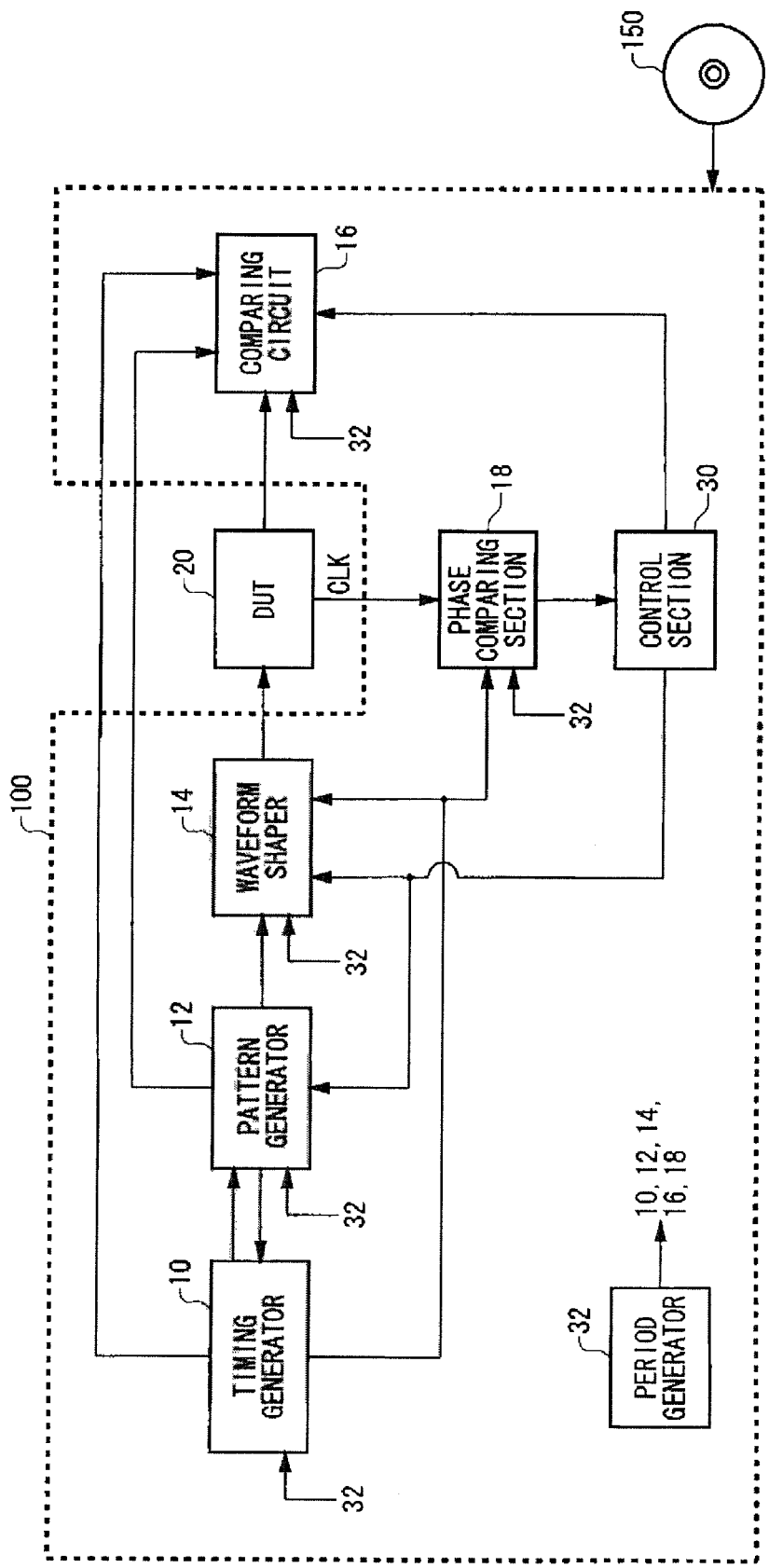
FIG. 1 is a view showing an entire configuration of a test apparatus 100.

FIG. 1 shows an entire configuration of a test apparatus 100. According to an object of the invention, the test apparatus 100 detects a phase difference between an operational clock signal of an electronic device 20 and a rate signal generated from the test apparatus 100 and delays a test signal to be input into the electronic device 20 by means of the phase difference in order to appropriately test the electronic device 20. According to this, although the electronic device 20 has an independent oscillation circuit, the test apparatus can appropriately test the electronic device 20. In addition, in FIG. 1, since the electronic device 20 is a device to be tested, the electronic device 20 is referred to as a device under test (DUT).

The test apparatus 100 includes a timing generator 10, a pattern generator 12, a waveform shaper 14, a comparing circuit 16, a phase comparing section 18, a control section 30, and a period generator 32. The timing generator 10 functions as a test signal generating section according to the present invention together with the pattern generator 12. The timing generator 10 generates a test signal to be supplied to the electronic device 20 in synchronization with a rate signal generated from the period generator 32. Specifically, the timing generator 10 generates a timing signal to operate the test apparatus 100. For example, the timing generator 10 receives a test set signal showing a timing, at which a test pattern is supplied to the electronic device 20, from the pattern generator 12, and supplies the signal showing a timing, at which a test pattern is supplied to the electronic device 20, to the waveform shaper 14. The pattern generator 12 generates a test pattern to test the electronic device 20, and supplies it to the waveform shaper 14.

The waveform shaper 14 shapes the test pattern in accordance with the signal received from the timing generator 10, and supplies it to the electronic device 20 as a test signal. The comparing circuit 16 decides the good or bad of the electronic device 20 based on an output signal output from the electronic device 20 in response to the given test pattern. The phase comparing section 18 receives an operational clock signal of the electronic device 20 generated from the electronic device 20, and detects a phase difference between the operational clock signal and the rate signal using the rate signal generated from the period generator 32 as a standard. When the phase comparing section 18 detects the phase difference, the phase comparing section 18 informs the control section 30 of that effect.

The control section 30 controls that the test apparatus 100 tests the electronic device 20. For example, the control section 30 reads phase difference information stored on a register in the phase comparing section 18 in accordance with a notice of detection of the phase difference. Then, the control section 30 sets a delay amount in the waveform shaper 14 and the comparing circuit 16 based on the phase difference information. Moreover, the control section 30 instructs the pattern generator 12 to generate a test signal for testing the electronic device 20. The period generator 32 supplies a reference clock to each component of the test apparatus 100. Moreover, the period generator 32 generates a rate signal determining a test period according to an operating period of the electronic device 20, and supplies it to each component of the test apparatus 100.

A program for realizing each function described above is read from a CD-ROM 150, and is installed in the test apparatus 100 to be executed. Alternatively, the program may be stored on a recording medium such as a flexible disk or an IC card to be provided by a user. A storage medium can include an optical recording medium such as a DVD or a PD, a magneto-optical recording medium such as an MD, a tape medium, and a semiconductor memory, in addition to the CD-ROM 150, the flexible disk, and the IC card. Moreover, a storage device such as a hard disk or a RAM that is provided in a server system connected to a private communication network or Internet may be used as a recording medium, and a program may be provided to the test apparatus 100 via a network. This program makes the test apparatus 100 function as the test apparatus 100 to be described with reference to FIG. 1 to FIG. 11. This program may make the test apparatus 100 function as the test apparatus 100 with any configuration to be described with reference to FIG. 1 to FIG. 11. For example, the control section 30 may execute each instruction included in this program to operate each component of the test apparatus 100. This program may include instructions making each component of the test apparatus function as described in FIG. 1 to FIG. 11. The control section 30 may have an arithmetic unit for executing these instructions to control each component.

Figure 2:
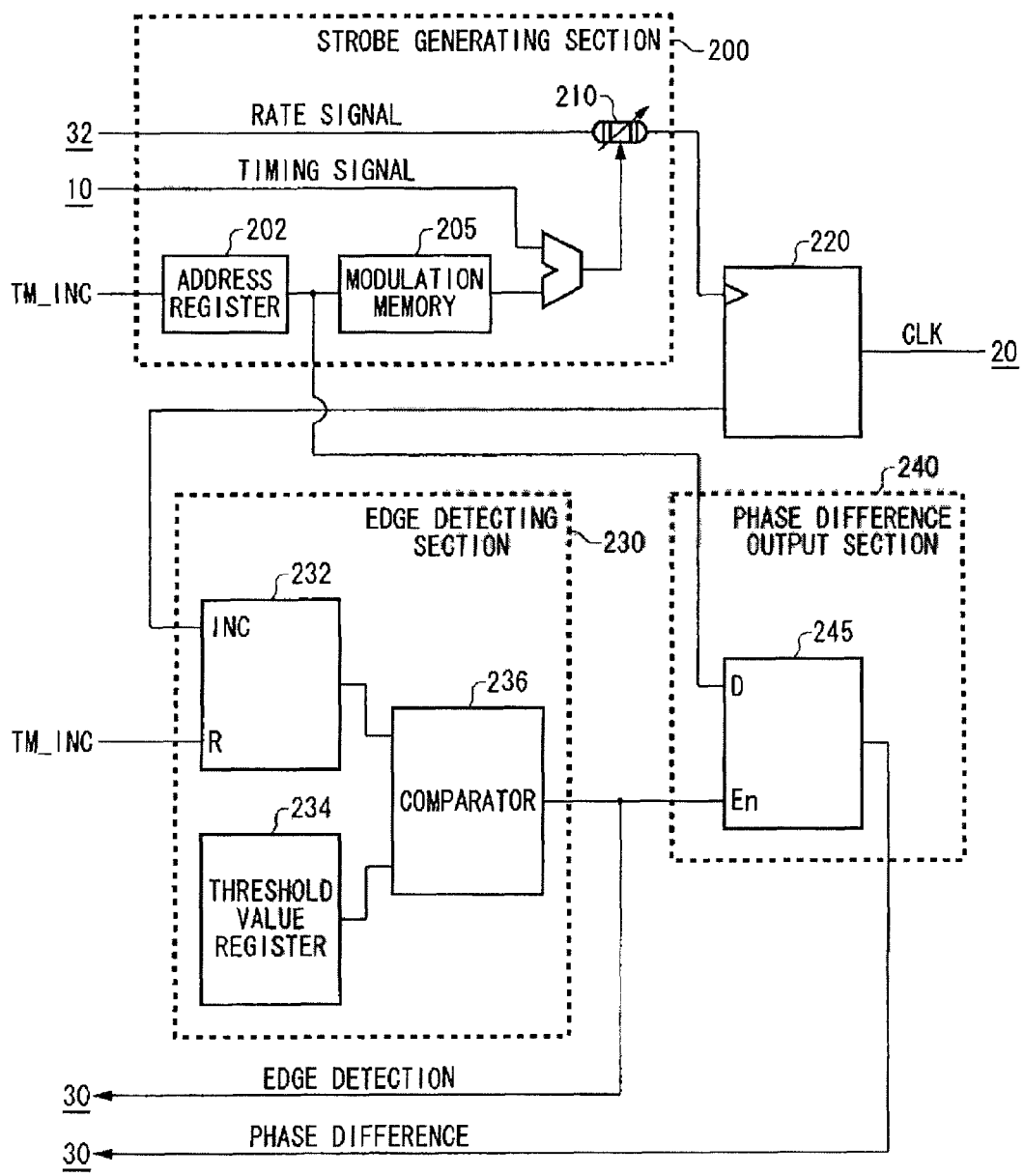
FIG. 2 is a view showing a functional configuration of a phase comparing section 18.

FIG. 2 shows a functional configuration of the phase comparing section 18. The phase comparing section 18 includes a strobe generating section 200, a timing comparator 220, an edge detecting section 230, and a phase difference output section 240. The strobe generating section 200 generates a strobe signal while sequentially changing a phase for the rate signal. Specifically, the strobe generating section 200 has an address register 202, a modulation memory 205, and a delay element 210.

The modulation memory 205 stores a modulation amount of the phase for the rate signal. The address register 202 outputs an address to be provided to the modulation memory 205. Based on the provided address, a modulation amount of phase is output from the modulation memory 205. This output modulation amount is added to a timing signal by an adder, and the added result is output to the delay element 210. The delay element 210 delays the rate signal in accordance with the input signal to output a strobe signal to the timing comparator 220. The strobe generating section 200 generates a strobe signal determining a phase for a rate signal based on the modulation amount read from the modulation memory 205 according to sequentially incrementing or decrementing the provided address.

The timing comparator 220 acquires the operational clock signal from the electronic device 20 at a timing designated by each strobe signal. The edge detecting section 230 detects an edge of the operational clock signal based on an operational clock signal value at each of the timings.

The edge detecting section 230 has a count section 232, a threshold value register 234, and a comparator 236. The count section 232 counts the number of times by which the operational clock signals acquired by the timing comparator 220 correspond to a predetermined logical value (for example, a positive logic one or a negative logic zero). That is to say, the count section 232 increments the number of times by one whenever the acquired operational clock signal is the predetermined logical value. Moreover, the count section 232 may reset the counting number of times according to the input of TM_INC signal.

The threshold value register 234 records a threshold value that is compared with the number of times counted by the count section 232. The comparator 236 compares the number of times counted by the count section 232 and the threshold value. The phase difference output section 240 outputs a phase difference based on a position of an edge of the operational clock signal for an edge of the rate signal to the control section 30. Specifically, the phase difference output section 240 has a register 245 for recording phase difference information indicative of a phase difference. Then, in response to the fact that the number of times counted by the count section 232 is not less than the threshold value, the phase difference output section 240 records an address value recorded in the address register 202 at that point in the register 245 as phase difference information. Then, in order to inform the control section 30 of the detection of phase difference, the phase difference output section 240 outputs an edge-detection signal showing that effect.

Figure 3:
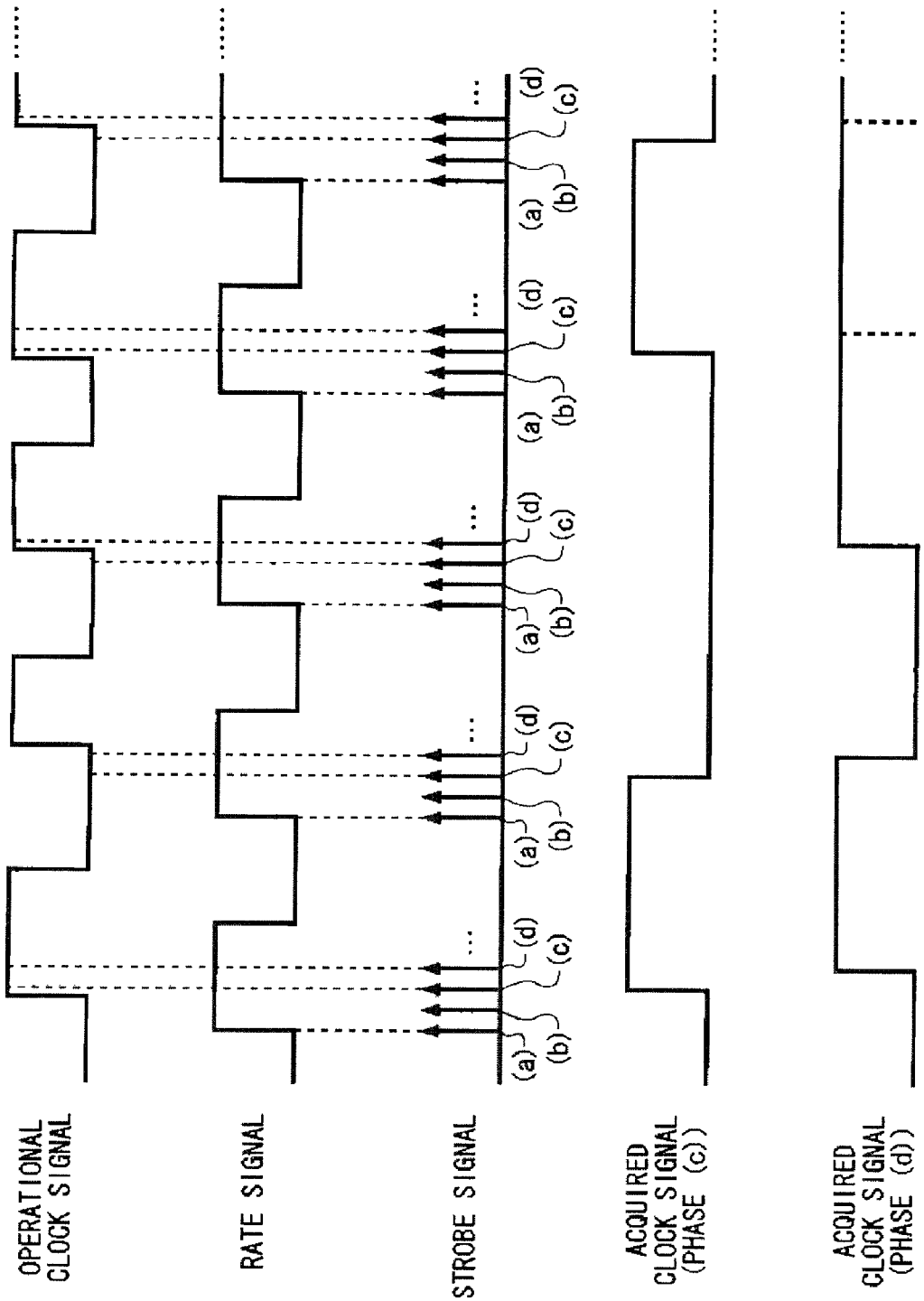
FIG. 3 is a view explaining a process for detecting an edge of an operational clock signal.

FIG. 3 shows a view explaining a process for detecting an edge of an operational clock signal. The electronic device 20 oscillates the operational clock signal by means of an independent oscillation circuit based on the clock signal received from the test apparatus 100. On the other hand, the test apparatus 100 makes the period generator 32 generate a rate signal determining a test period according to an operating period of the electronic device 20. In this case, the operational clock signal and the rate signal may have different phases even if they have the same period. In order to detect these phase differences, the strobe generating section 200 generates a strobe signal. The strobe generating section 200 generates a plurality of strobe signals for a plurality of phases of the rate signal. For example, strobe signals corresponding to phases (a) to (d) of the rate signal are strobe signals (a) to (d).

The strobe generating section 200 generates a plurality of predetermined strobe signals for each phase while sequentially increasing (or decreasing) a phase for the rate signal. That is to say, for example, the strobe generating section 200 first generates a strobe signal for the phase (a) whenever the rate signal rises, and when the generated number of times reaches the predetermined number of times (for example, 100 times), generates a strobe signal for the phase (b) whenever the rate signal rises. Next, the strobe generating section 200 generates a strobe signal for the phase (c) that is an example of the first phase whenever the rate signal rises, and then generates a strobe signal for the phase (d) that is an example of the second phase whenever the rate signal rises.

The timing comparator 220 acquires operational clock signals at timings designated by the strobe signals that are sequentially output every cycle for the plurality of phases. For example, the timing comparator 220 first acquires operational clock signals at the plurality of timings designated by the plurality of strobe signals, with respect to the phase (c). With respect to the phase (c), a predetermined logical value (for example, a positive logic one) is acquired at the first and the fourth rising edges, but is not acquired at the second, the third, and the fifth rising edges. Next, the timing comparator 220 acquires operational clock signals at the plurality of timings designated by the plurality of strobe signals with respect to the phase (d). With respect to the phase (d), a predetermined logical value is acquired excepting the second rising edge.

The register 245 counts the number of times by which the operational clock signal becomes a predetermined logical value with respect to each phase. That is to say, in an example of FIG. 3, the number of times counted for the phase (c) is two times, and the number of times counted for the phase (d) is four times.

The edge detecting section 230 detects that the edge of the operational clock signal is between the phase (c) and the phase (d), on condition that the number of times counted for the phase (c) is not more than a predetermined threshold value (for example, three times) and the number of times counted for the phase (d) is not less than the predetermined threshold value. That is to say, in an example of FIG. 3, it is detected that the edge of the operational clock signal is between the phase (c) and the phase (d). In addition, for example, this threshold value in the present embodiment may be a half of the number of times obtained by counting the logical value of the operational clock signal. For example, when the edge detecting section 230 counts the logical value 100 times for a certain phase, this threshold value may be 50 times.

Alternatively, in response to the fact that the number of times counted by the timing comparator 220 for a certain phase becomes not less than the threshold value while sequentially increasing the phase, the edge detecting section 230 may detect that the edge of the operational clock signal is at the substantially same position as the phase. That is to say, in an example of the present drawing, since the number of times counted for the phase (d) first becomes not less than the threshold value, it is detected that the edge of the operational clock signal is at the substantially same position as the phase (d). If an increment of a phase which is sequentially increased is adequately small, it is possible to detect an edge by means of this method with high precision.

In further another example, the edge detecting section 230 may detect that the edge of the operational clock signal is between a first phase and a second phase on condition that, in case of the first phase, a ratio that the operational clock signal is a first logical value (for example, one of binary) is not more than a ratio that the operational clock signal is a second logical value (for example, zero of binary) and, in case of the second phase, the ratio that the operational clock signal is the first logical value is not less than the ratio that the operational clock signal is the second logical value. According to this method, although a threshold value is not particularly provided and also the number of times of strobe signals generated for each of the plurality of phases is different, it is possible to appropriately detect an edge of an operational clock signal.

Figure 4:
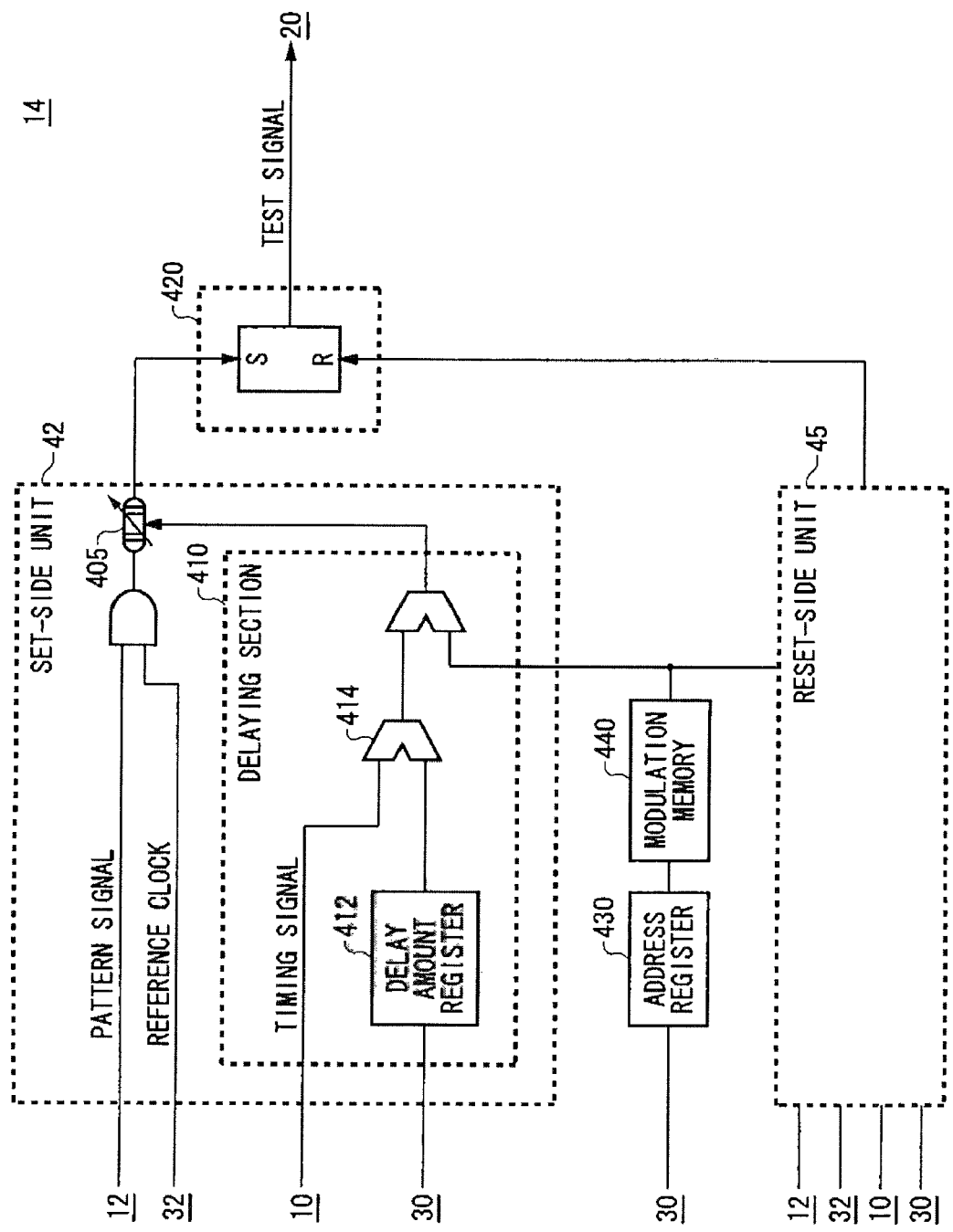
FIG. 4 is a view showing a functional configuration of a waveform shaper 14.

FIG. 4 shows a functional configuration of the waveform shaper 14. According to an object of the present embodiment, the waveform shaper 14 supplies a test signal to be input into the electronic device 20 in order to decide the good or bad of the electronic device 20 to the electronic device 20 at a timing synchronized with an operational clock signal of the electronic device 20. The waveform shaper 14 has a set-side unit 42, a reset-side unit 45, and a test signal supplying section 420 for each input pin of the electronic device 20. The set-side unit 42 determines a timing at which the test signal is changed from the first logical value to the second logical value. On the other hand, the reset-side unit 45 determines a timing at which the test signal is changed from the second logical value to the first logical value.

The test signal supplying section 420 changes a logical value of the test signal in accordance with a signal received from the set-side unit 42. Moreover, the test signal supplying section 420 changes a logical value of the test signal in accordance with a signal received from the reset-side unit 45. Hereby, the test signal supplying section 420 outputs a pattern signal input by the pattern generator 12 at a timing at which a phase difference between the pattern signal and the rate signal becomes a desired size. According to this, the electronic device 20 is supplied with the test signal delayed by the phase difference with a desired size.

The set-side unit 42 has a delay element 405 and a delaying section 410. The set-side unit 42 acquires a pattern signal from the pattern generator 12, acquires a reference clock from the period generator 32, and acquires a timing signal from the timing generator 10. Moreover, the set-side unit 42 receives setting of a delay amount based on the phase difference detected from the phase comparing section 18 from the control section 30.

The delaying section 410 delays the test signal in accordance with the phase difference detected from the phase comparing section 18 and delays the reference clock to substantially synchronize the clock with the operational clock signal. Therefore, the delaying section generates a signal, in which a phase difference between the signal and the rate signal generated from the period generator 32 becomes a desired size. Specifically, the delaying section 410 has a delay amount register 412 and an adder 414. The delay amount register 412 receives setting of a delay amount based on the phase difference detected from the phase comparing section 18 from the control section 30. The adder 414 adds the delay amount to the timing signal input by the timing generator 10 and outputs the result. The delay element 405 generates a signal obtained by delaying a logical product of the pattern signal and the reference clock in accordance with a timing signal obtained by adding the delay amount. Then, the delay element 405 outputs the generated signal to a set-side terminal of the test signal supplying section 420.

Additionally, the waveform shaping section 14 may further have an address register 430 and a modulation memory 440. The modulation memory 440 records a plurality of modulation amounts for the test signal. This modulation amount may be given as a phase difference for the rate signal. The address register 430 records an address to be provided to the modulation memory 440 and outputs the address to the modulation memory 440. An address value of this address may be set by the control section 30. That is to say, for example, the control section 30 sequentially changes an address value of the address register 430 to make the modulation memory 440 sequentially output a different modulation amount. This modulation amount may be a positive value or a negative value. The delay amount adds or subtracts (in other words, addition if the modulation amount is positive and subtraction if negative) the modulation amount output from the modulation memory 440 to or from a delay amount already set in the delay amount register 412 in accordance with the phase difference of the reference clock, in order to modulate the test signal.

In addition, since the reset-side unit 45 has the substantially same configuration as that of the set-side unit 42 excepting supplying a signal to a reset-side terminal of the test signal supplying section 420, their descriptions are omitted.

According to this configuration, admissibility of an input signal for jitter can be tested by sequentially changing an address value to be recorded in the address register 430. Moreover, since this address value can be changed by the control section 30, flexibility of jitter for control can be raised. That is to say, control using conventional timing set (TS) requires setting a value in each control register after mounting the control register or the like according to frequency of jitter on the test apparatus. However, the test apparatus according to the present embodiment can dynamically control the generation of jitter by means of a program instructing the control section 30 to perform an operation.

In addition, when two test signals are output in one period of the rate signal, the waveform shaping section 14 may have a first modulation memory for providing jitter to a first test signal and a second modulation memory for providing jitter to a second test signal. According to such a configuration, it is possible to independently provide jitter every test signal and broaden the variation of test.

Figure 5:
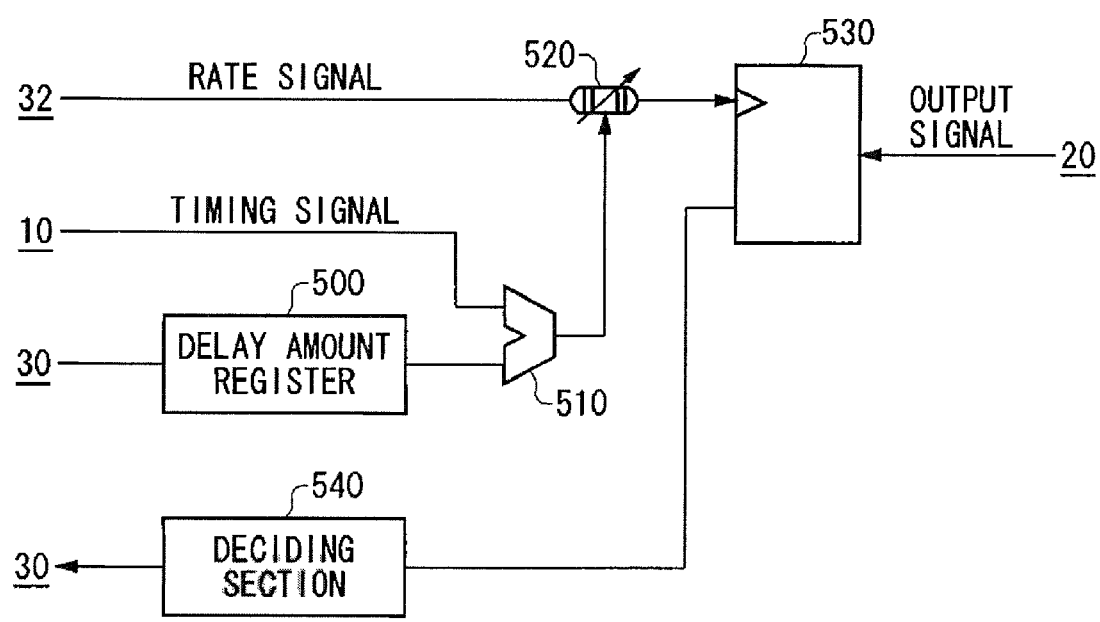
FIG. 5 is a view showing a functional configuration of a comparing circuit 16.

FIG. 5 shows a functional configuration of the comparing circuit 16. According to an object of the present embodiment, the comparing circuit 16 acquires an output signal output from the electronic device 20 in accordance with the input test signal from the electronic device 20 at a timing synchronized with an operational clock signal of the electronic device 20. The comparing circuit 16 has a delay amount register 500, an adder 510, a delay element 520, a signal acquiring section 530, and a deciding section 540, every output pin of the electronic device 20. The delay amount register 500 receives setting of a delay amount based on the phase difference detected from the phase comparing section 18 from the control section 30.

The adder 510 adds the delay amount to the timing signal input by the timing generator 10 and outputs the result. The delay element 520 delays the rate signal generated from the period generator 32 according to the input delay amount and inputs the delayed signal into the signal acquiring section 530. The signal acquiring section 530 acquires the output signal from the electronic device 20 according to the delayed rate signal. The deciding section 540 decides the success or failure of test based on the acquired output signal to judge the good or bad of the electronic device 20. The judgment result may be output to the control section 30 or the like.

Figure 6:
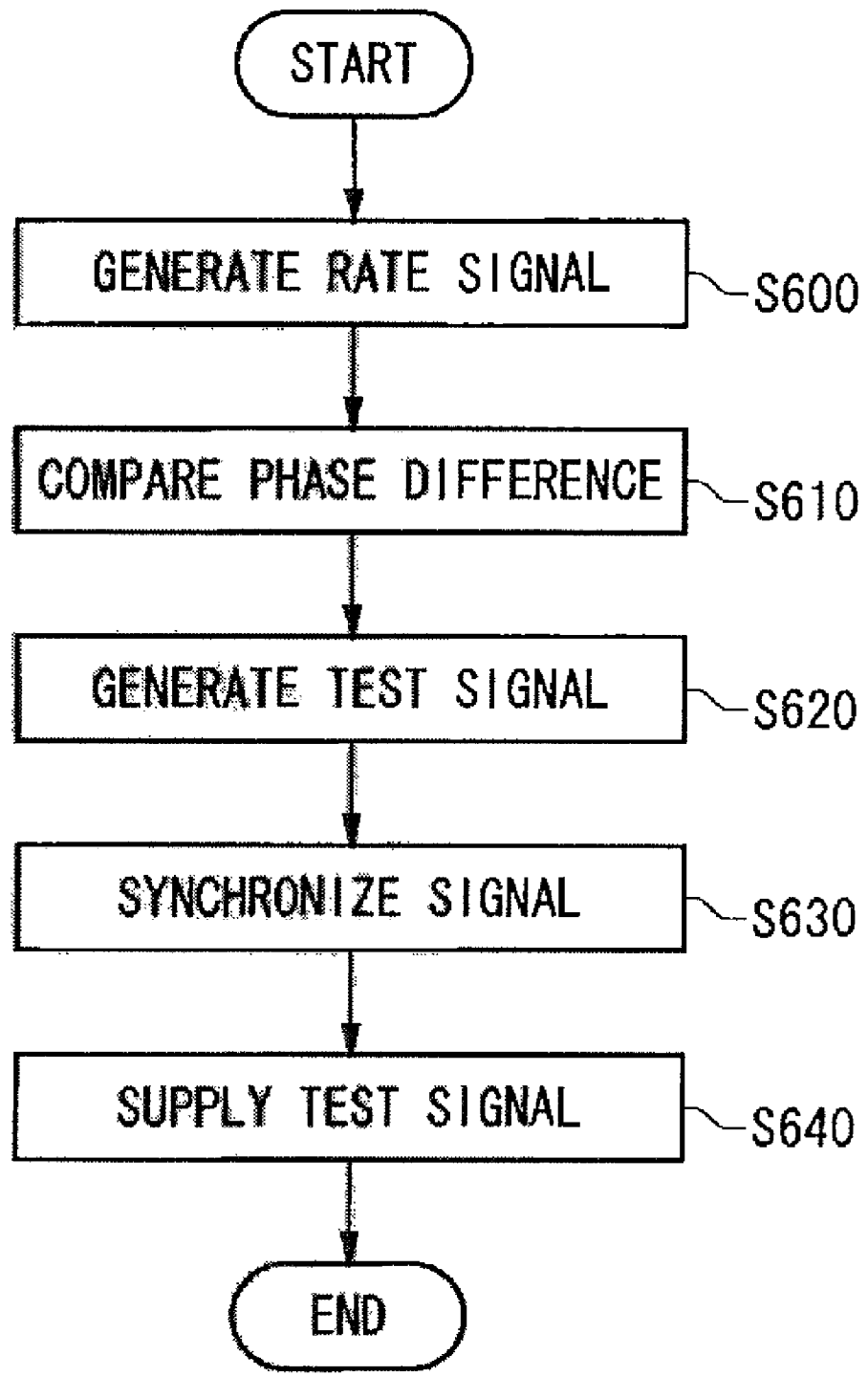
FIG. 6 is a flowchart showing an operation of a test apparatus 100.

FIG. 6 is a flowchart showing an operation of the test apparatus 100. First, the period generator 32 starts generating a rate signal determining a test period in accordance with an operating period of the electronic device 20 (S600). Next, the phase comparing section 18 inputs the operational clock signal of the electronic device 20 generated from the electronic device 20, and detects a phase difference between the operational clock signal and the rate signal using the rate signal as a standard (S610). When the phase difference has been detected, the phase difference output section 240 informs the control section 30 of that effect. According to this, the control section 30 instructs the pattern generator 12 or the like to start generating a test signal. That is to say, the pattern generator 12 starts generating the test signal to test the electronic device 20 on condition that the phase difference has been detected by the phase comparing section 18 (S620). The delaying section 410 delays the test signal in accordance with the detected phase difference to substantially synchronize it with the operational clock signal (S630). The test signal supplying section 420 supplies the delayed test signal to the electronic device 20 (S640).

As above, according to the test apparatus 100 of the present embodiment, although the electronic device 20 generates an operational clock signal by means of an independent oscillation circuit, a rate signal generated from the test apparatus 100 can be synchronized with the operational clock signal. According to this, since the supply and acquisition of signal to and from the electronic device 20 are appropriately performed, the electronic device 20 can be appropriately tested. The synchronization of signal is realized by detecting an edge of an operational clock signal by means of the plurality of strobe signals. According to this, it is possible to precisely and effectively synchronize a rate signal and an operational clock signal.

Figure 7:
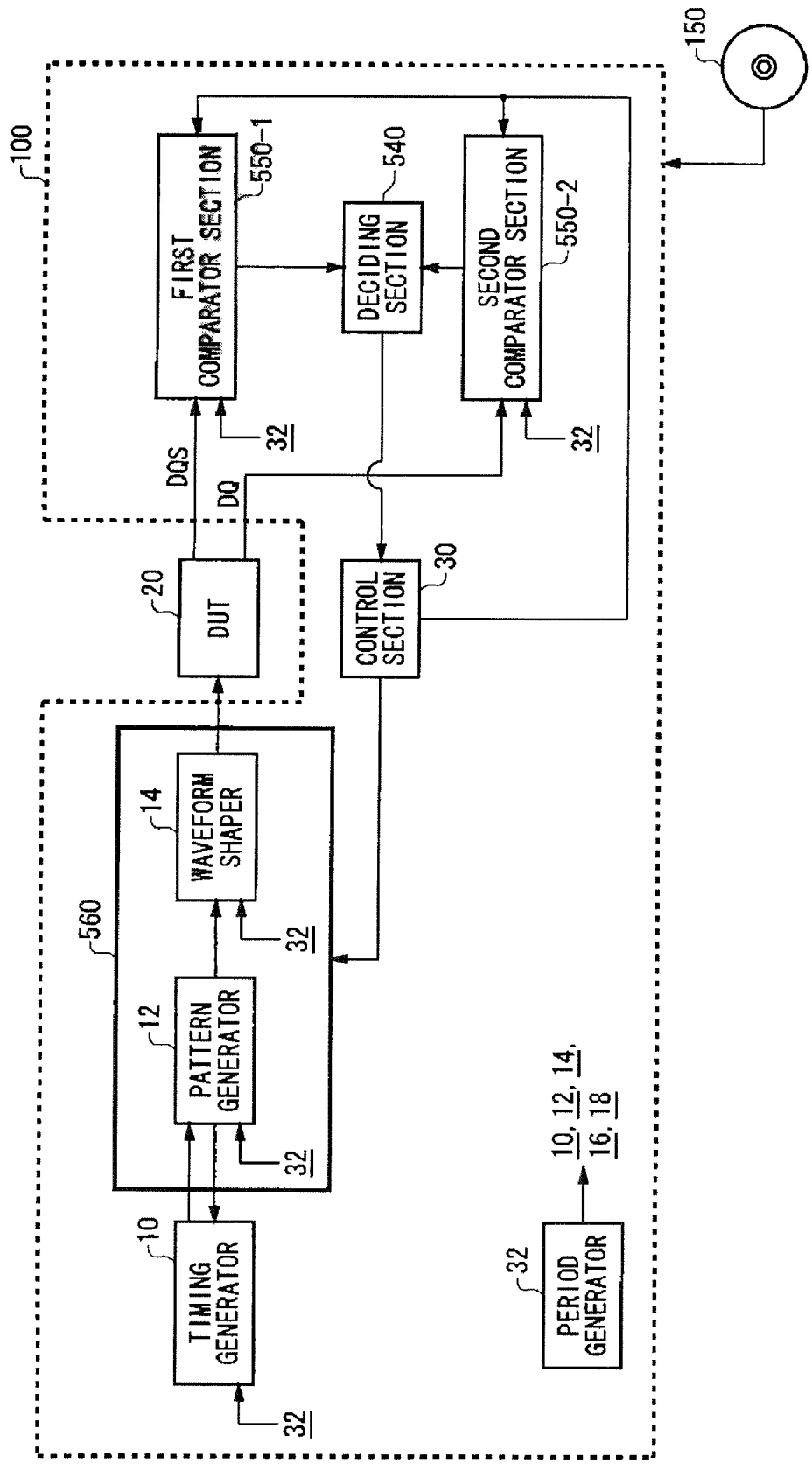
FIG. 7 is a view showing another example of a configuration of a test apparatus 100.

FIG. 7 is a view showing another configuration of a test apparatus 100. The test apparatus 100 described with reference to FIG. 1 detects a phase difference between an operational clock signal and a rate signal by sequentially shifting a phase of a strobe signal. Then, since a delay amount of the delay element 405 is set based on the detected phase difference, operations of the test apparatus 100 and the electronic device 20 are synchronized. On the contrary, the test apparatus 100 in the present example sequentially shifts a phase of a strobe signal and at the same time shifts a delay amount of a delay element for delaying a test signal with the generally same shift amount.

Then, operations of the test apparatus 100 and the electronic device 20 are synchronized by means of using a phase of a strobe signal and a delay amount of a delay element as a reference value when the strobe signal detects the edge of the operational clock signal. In other words, a process that shifts the phase of the strobe signal and synchronizes it with the operational clock signal corresponds to a process that detects the phase difference between the rate signal and the operating clock in the test apparatus 100 shown in FIG. 1, and a process that simultaneously shifts a delay amount of the delay element corresponds to a process that delays a test signal in accordance with the phase difference in the test apparatus 100 shown in FIG. 1.

The test apparatus 100 includes a driver section 560 (a pattern generator 12 and a waveform shaper 14), a period generator 32, a control section 30, a first comparator section 550-1, a second comparator section 550-2, and a deciding section 540. The timing generator 10, the pattern generator 12, the period generator 32, and the waveform shaper 14 may be equal to the components having the same reference numerals that are described in FIG. 1. However, another configuration example of the waveform shaper 14 will be below described in FIG. 10.

The driver section 560 generates a test signal to be supplied to the electronic device 20 and supplies it to the electronic device 20. In addition, the driver section 560 outputs a test signal in accordance with a driver timing generated from a driver timing generating section 300 to be described below in FIG. 10. A driver timing is a timing having a relative phase to be set for a rate signal.

The first comparator section 550-1 and the second comparator section 550-2 compare a phase of an output signal output from the electronic device 20 and a phase of a given strobe signal. A strobe signal is a signal showing a timing having a relative phase to be set for a rate signal.

In the present example, the first comparator section 550-1 receives an operational clock signal DQS of the electronic device 20 as this output signal, and compares it with a first strobe signal. Moreover, the second comparator section 550-2 receives a data signal DQ output from the electronic device 20 in accordance with the test signal as this output signal, and compares it with a second strobe signal. Here, the comparison of phase may be a process for detecting a logical value of an output signal at a timing of a strobe signal. For example, the first comparator section 550-1 and the second comparator section 550-2 may sample, for each cycle of a rate signal, a logical value of an output signal from the electronic device 20 at a timing of a given strobe signal.

The deciding section 540 decides the good or bad of the electronic device 20 based on a logical value of an output signal detected from the first comparator section 550-1 and the second comparator section 550-2. For example, the deciding section 540 may decide the good or bad of the electronic device 20 by comparing a logic pattern of data signal DQ and a logic pattern to be expected. Moreover, the deciding section 540 may detect a phase difference between the operational clock signal DQS and the data signal DQ based on a difference between transition timings of logical values detected from the first comparator section 550-1 and the second comparator section 550-2. The deciding section 540 may decide the good or bad of the electronic device 20 based on whether this phase difference is within a predetermined range.

The control section 30 controls the test apparatus 100 to test the electronic device 20 based on a given program. Moreover, the control section 30 synchronizes operations of the test apparatus 100 and the electronic device 20 with each other based on the given program, as described above. The synchronization between the test apparatus 100 and the electronic device 20 may be performed before a test signal is input into the electronic device 20. An operational clock signal may be a signal independently generated from the electronic device 20. In this case, the test apparatus 100 and the electronic device 20 can be synchronized with each other based on an operational clock signal without inputting a test signal into the electronic device 20.

Moreover, the electronic device 20 may be a device that operates in accordance with a clock provided from the test apparatus 100. In this case, the test apparatus 100 may input the operational clock signal into the electronic device 20, and perform a process synchronizing the test apparatus 100 and the electronic device 20 with each other. Moreover, a program performing these processes may be, for example, provided from a user. Additionally, the control section 30 may be included in the pattern generator 12 or the like.

Figure 8:
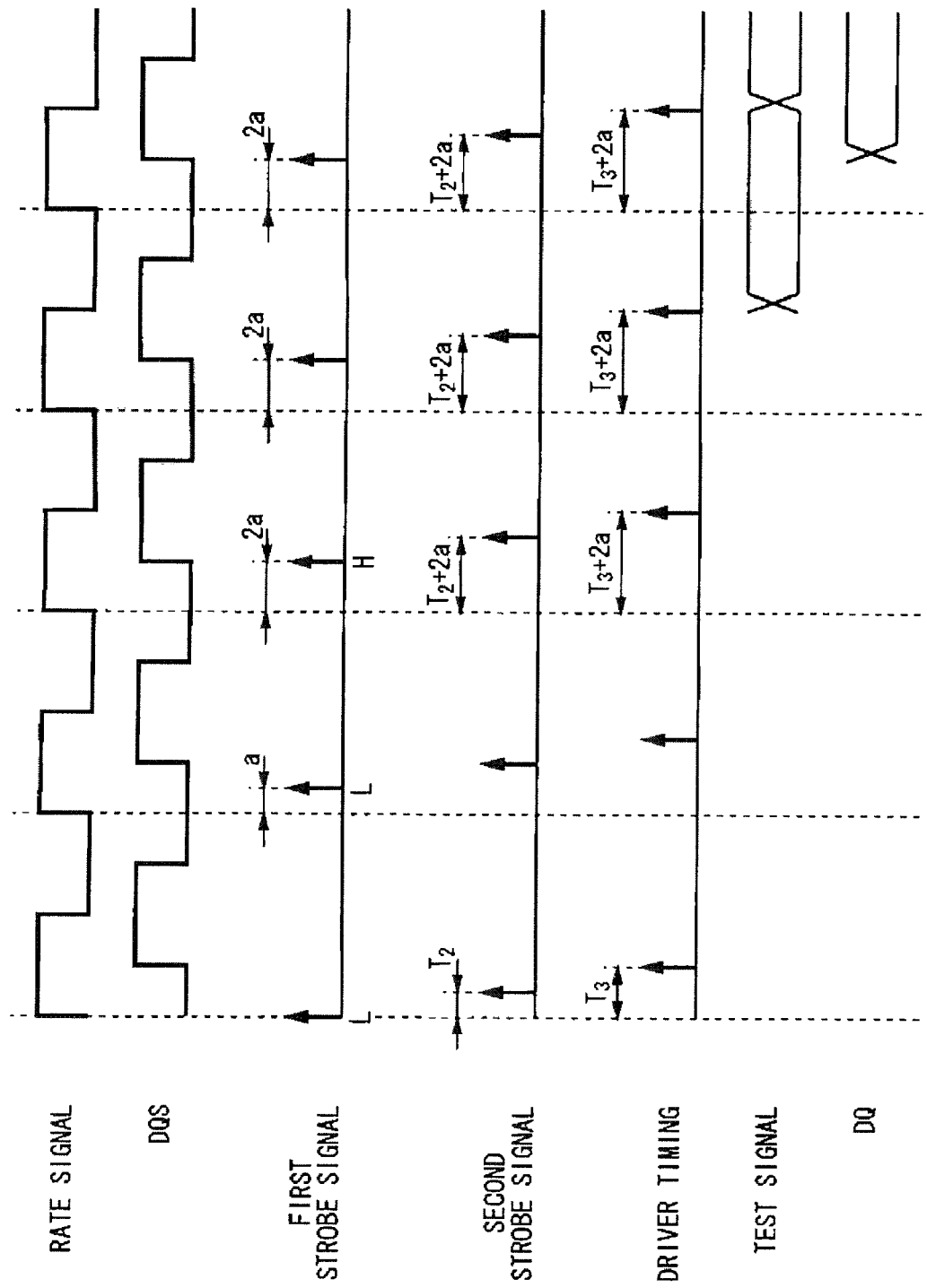
FIG. 8 is a timing chart exemplary showing an operation of a test apparatus 100.

FIG. 8 is a timing chart exemplary showing an operation of the test apparatus 100. The period generator 32 generates a rate signal synchronized with the operational clock signal DQS of the electronic device 20. Since the operational clock signal DQS and the rate signal are independently generated, a phase difference as shown in FIG. 8 may be generated between them.

First, the control section 30 shifts the first strobe signal, the second strobe signal, and the driver timing with the generally same shift amount in order to appropriately set each timing before inputting the test signal into the electronic device 20. It is preferable that the shift of the first strobe signal, the second strobe signal, and the driver timing are simultaneously performed.

In case of the first strobe signal, the second strobe signal, and the driver timing, relative phases (strobe positions) for the rate signal are previously set by a program or the like provided from a user. In the present example, the first strobe signal has T1 (=0) as a phase difference for a rate signal, the second strobe signal has T2 as this phase difference, and the third strobe signal has T3 as this phase difference.

The control section 30 sequentially changes setting of the relative phase of the first strobe signal for each cycle of the rate signal. In the present example, the control section 30 increases setting of the relative phase of the first strobe signal by "a" for each cycle of the rate signal. The control section 30 simultaneously changes setting of the relative phase of the second strobe signal and the driver timing with the generally same change amount (in the present example, an increased amount a).

At this time, the first comparator section 550-1 detects a logical value of DQS at a phase (a timing) of the first strobe signal. In this example, a logical value L is detected in the first cycle and the second cycle of the rate signal. Moreover, a logical value H is detected in the third cycle of the rate signal.

The control section 30 may receive a comparison result obtained by comparing the logical value detected from the first comparator section 550-1 and a predetermined expected value by the deciding section 540, and decide whether phases of the first strobe signal and DQS are substantially identical with each other based on this comparison result. For example, High logic is set in the deciding section 540 as an expected value corresponding to the first comparator section 550-1. The control section 30 may determine that phases are substantially identical when the decision result by the deciding section 540 changes from a fail (mismatch) to a pass (match).

In addition, while performing a process synchronizing the test apparatus 100 and the electronic device 20, an expected value corresponding to the second comparator section 550-2 may not be set in the deciding section 540 (that is to say, it may be a don't care expected value). Moreover, in FIG. 7, the deciding section 540 is commonly provided for the comparator sections 550. However, the deciding section 540 may be respectively provided for the comparator sections 550. Moreover, the control section 30 may be included in the pattern generator 12. When performing a process synchronizing the test apparatus 100 and the electronic device 20, the control section 30 sets a timing of each pin based on a timing at which a comparison result corresponding to the previously designated comparator section 550 (in this example, the first comparator section 550-1) becomes a pass.

Moreover, the control section 30 may receive the logical value detected from the first comparator section 550-1, and decide whether phases of the first strobe signal and DQS are substantially identical based on this logical value. For example, when the logical value of DQS detected from the first comparator section 550-1 is changed into a predetermined logical value, the control section 30 decides that phases of the first strobe signal and DQS are substantially identical with each other. In the present example, when the logical value of DQS is changed into High logic, the first comparator section 550-1 decides that phases of the first strobe signal and DQS are substantially identical with each other.

When phases of the first strobe signal and DQS are substantially identical with each other, the control section 30 stops changing setting of relative phases of the first strobe signal, the second strobe signal, and the driver timing. At this time, the first comparator section 550-1, the second comparator section 550-2, and the driver section 560 holds these relative phases. In an example of FIG. 8, the first comparator section 550-1 holds a relative phase 2a. Moreover, the second comparator section 550-2 holds a relative phase T2+2a. Moreover, the driver section 560 holds a relative phase T3+2a.

In this manner, after setting the first strobe signal, the second strobe signal, and the driver timing, the control section 30 causes the driver section 560 to output a test signal and tests the electronic device 20. At this time, since the driver section 560 holds the relative phase T3+2a, the test signal has a desired phase difference (T3 in the present example) for DQS. In addition, the test apparatus 100 continuously generates a rate signal over the process for synchronizing the test apparatus 100 and the electronic device 20 and the process for inputting a test signal into the electronic device 20 to test the electronic device. According to this, the electronic device 20 can be tested in a state where the test apparatus 100 and the electronic device 20 have been synchronized.

Then, the second comparator section 550-2 samples the data signal DQ output from the electronic device 20. At this time, since the second comparator section 550-2 holds the relative phase T2+2a, the second comparator section can sample DQ at a desired timing. In addition, the data signal DQ is a signal that is output in synchronization with the operational clock signal DQS.

By such a process, the test can be performed after synchronizing the test apparatus 100 and the electronic device 20. For this reason, it is possible to appropriately test the electronic device 20. Moreover, since the test apparatus 100 in the present example performs one sampling in each cycle of a rate signal, the test apparatus may not include the edge detecting section 230 described in FIG. 2. Moreover, the test apparatus 100 does not detect a concrete phase difference value between the rate signal and the operational clock signal. For this reason, the test apparatus may not include the phase difference output section 240 described in FIG. 2. Therefore, the test apparatus 100 in the present example can appropriately test the electronic device 20 on a comparatively small circuit scale.

Figure 9:
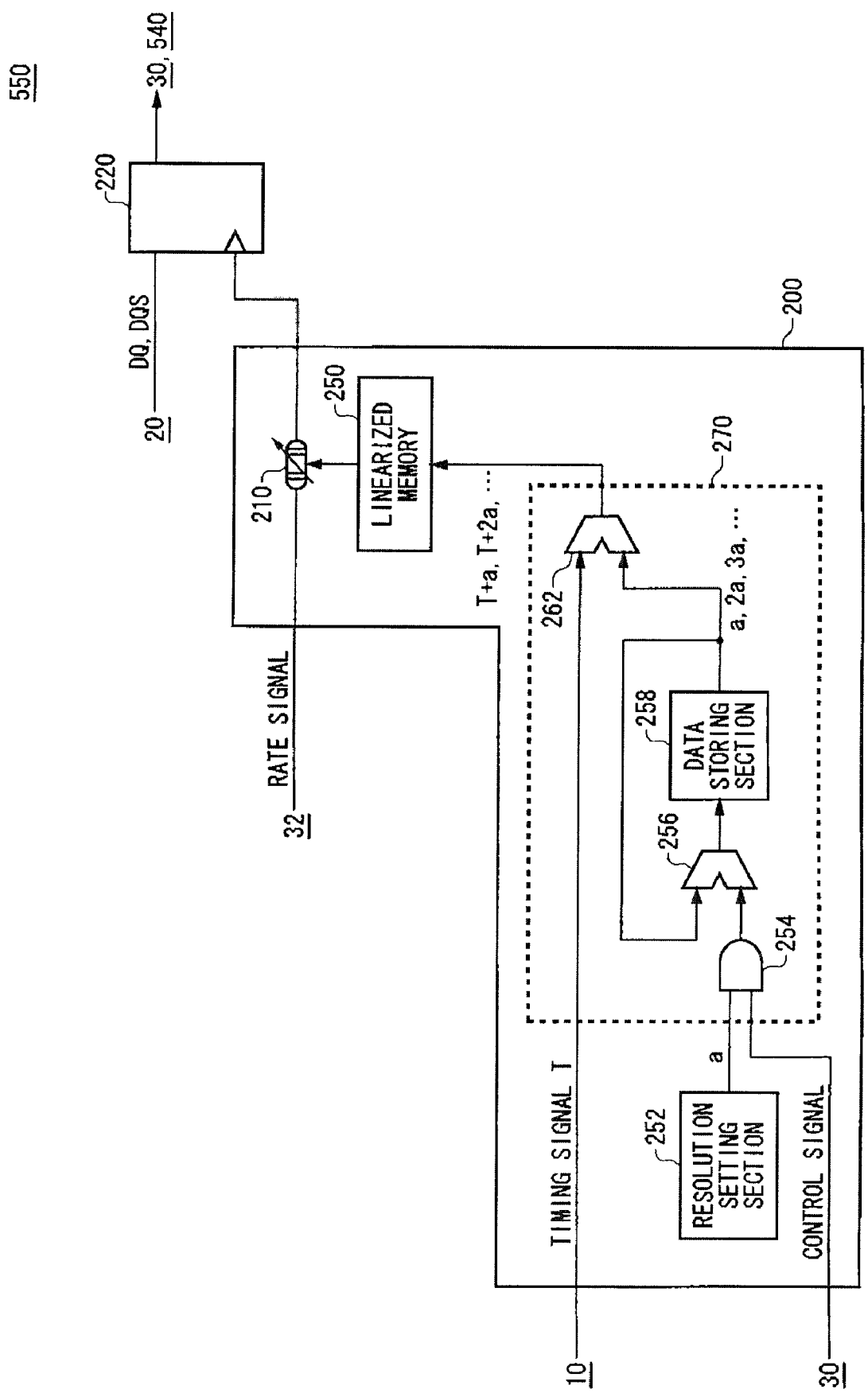
FIG. 9 is a view exemplary showing a configuration of a first comparator section 550-1 and a second comparator section 550-2.

FIG. 9 is a view exemplary showing a configuration of the first comparator section 550-1 and the second comparator section 550-2. In addition, the first comparator section 550-1 and the second comparator section 550-2 respectively have a configuration shown in FIG. 9. In other words, the first comparator section 550-1 and the second comparator section 550-2 may have the same configuration. Hereinafter, the first comparator section 550-1 and the second comparator section 550-2 are generally described as the comparator section 550.

The comparator section 550 has a strobe generating section 200 and a timing comparator 220. The timing comparator 220 detects a logical value of an output signal (DQ or DQS) from the electronic device 20 in accordance with a given strobe signal. The timing comparator 220 outputs the detected logical value to the deciding section 540 and the control section 30.

The strobe generating section 200 has a delay element 210, a linearized memory 250, a resolution setting section 252, and a strobe shifting section 270. Moreover, the strobe generating section 200 is supplied with a timing signal T showing an initial value of a relative phase for a rate signal, for example, from the timing generator 10. The timing signal T corresponds to the relative phase T1 (=0) or T2 described in FIG. 8.

The resolution setting section 252 stores a resolution data "a" showing a unit change amount every cycle when a phase of a strobe signal is sequentially changed every cycle of a rate signal. The timing signal T provided from the timing generator 10 and the resolution data "a" may be previously set by a user. For example, the control section 30 may set them in accordance with a program provided from a user.

The strobe shifting section 270 receives the timing signal T and the resolution data "a", and generates a delay setting data controlling a delay amount of the delay element 210 based on the received data. The delay element 210 delays the rate signal provided from the period generator 32 with a delay amount according to a given control signal and outputs it as a strobe signal, similarly to the delay element 210 described in FIG. 2.

The linearized memory 250 supplies a control signal according to the delay setting data provided from the strobe shifting section 270 to the delay element 210. The linearized memory 250 may store a table in which each of the delay setting data and a control signal to be provided to the delay element 210 are associated with each other. For example, the linearized memory 250 associates the control signal with the delay setting data so that a delay amount shown by each delay setting data is identical with a delay amount really generated from the delay element 210.

The strobe shifting section 270 sequentially changes the delay amount of the delay element 210 with a shift amount shown by the resolution data "a" from an initial delay amount shown by the timing signal T. For example, the strobe shifting section 270 outputs the delay setting data that are sequentially changed like T, T+a, T+2a, . . . .

The strobe shifting section 270 has an AND circuit 254, a shift addition section 256, a data storing section 258, and an offset addition section 262. The AND circuit 254 outputs a logical product of the resolution data "a" provided from the resolution setting section 252 and the control signal.

The shift addition section 256 adds the resolution data "a" passed through by the AND circuit 254 and a data value of data output from the data storing section 258 and outputs the result. The data storing section 258 stores and outputs the data output from the shift addition section 256. In other words, while a High-logic control signal is given to the AND circuit 254, a value of data output from the shift addition section 256 increases by the resolution data "a" like a, 2a, 3a, . . . . Moreover, the shift addition section 256 may add the resolution data "a" to the data output from the data storing section 258 and output the result, in synchronization with the rate signal.

The control section 30 provides the High-logic control signal to the AND circuit 254 from starting a process for synchronizing operations of the test apparatus 100 and the electronic device 20 to substantially matching the phase of the first strobe signal to the phase of DQS. Moreover, when detecting that the phase of the first strobe signal and the phase of DQS are identical with each other, the control section transits a logical value of a control signal into Low logic. A relative phase (in the present example, a shift amount of a relative phase) of each strobe signal, when detecting that the phases of the first strobe signal and DQS are identical with each other, by transiting a logical value of a control signal into Low logic is held in the data storing section 258. By such a control, the operations described in FIG. 8 can be performed. The control section 30 may be supplied with a program including instructions making the control section 30 execute this process.

The offset addition section 262 adds a data value output from the data storing section 258 and a data value of the timing signal T, and outputs the result to the linearized memory 250 and the phase difference output section 240. By such a configuration, as described above, it is possible to generate the delay setting data that sequentially changes like T, T+a, T+2a, . . . . By such a configuration, it is possible to shift a phase of a strobe signal with an arbitrary initial phase and arbitrary resolution to synchronize each strobe signal and the operating clock DQS.

The strobe generating section 200 in the present example can be also used in a configuration described in FIG. 2. In this case, an output from the offset addition section 262 may be supplied to the phase difference output section 240.

Moreover, as described in FIG. 3, when a plurality of strobe signals is generated for each of the phases (a) to (d), the AND circuit 254 may be supplied with a Low-logic control signal while respectively generating the plurality of strobe signals. While the Low-logic control signal is being supplied, since the shift addition section 256 adds zero to the data output from the data storing section 258 and outputs the result, the delay setting data does not vary. That is to say, the plurality of strobe signals is generated in this phase. Then, when the strobe signal is generated by the predetermined the number of times in this phase, the High-logic control signal is given and the resolution data "a" is added to the delay setting data. As described in FIG. 3, it is possible to generate the strobe signal by multiple times in each phase by repeating such a process. Moreover, a timing at which the control signal shows High logic or Low logic may be controlled in accordance with a program provided from a user, similarly to the timing signal T and the resolution data "a".

Moreover, in the above-described example, an example for generating one strobe signal for each cycle of a rate signal has been explained. However, in another example, a plurality of strobe signals may be generated for each cycle of a rate signal. For example, since the plurality of comparator sections 550 shown in FIG. 9 is assigned to one output pin of the electronic device 20, the operating clock DQS can be sampled at the plurality of different timings for each cycle of a rate signal. In this case, for example, the plurality of comparator sections 550 may have different data values of timing signal T. Then, since the plurality of comparator sections 550 splits and receives the operating clock DQS, the operating clock DQS can be sampled at the plurality of timings for each cycle of a rate signal.

Figure 10:
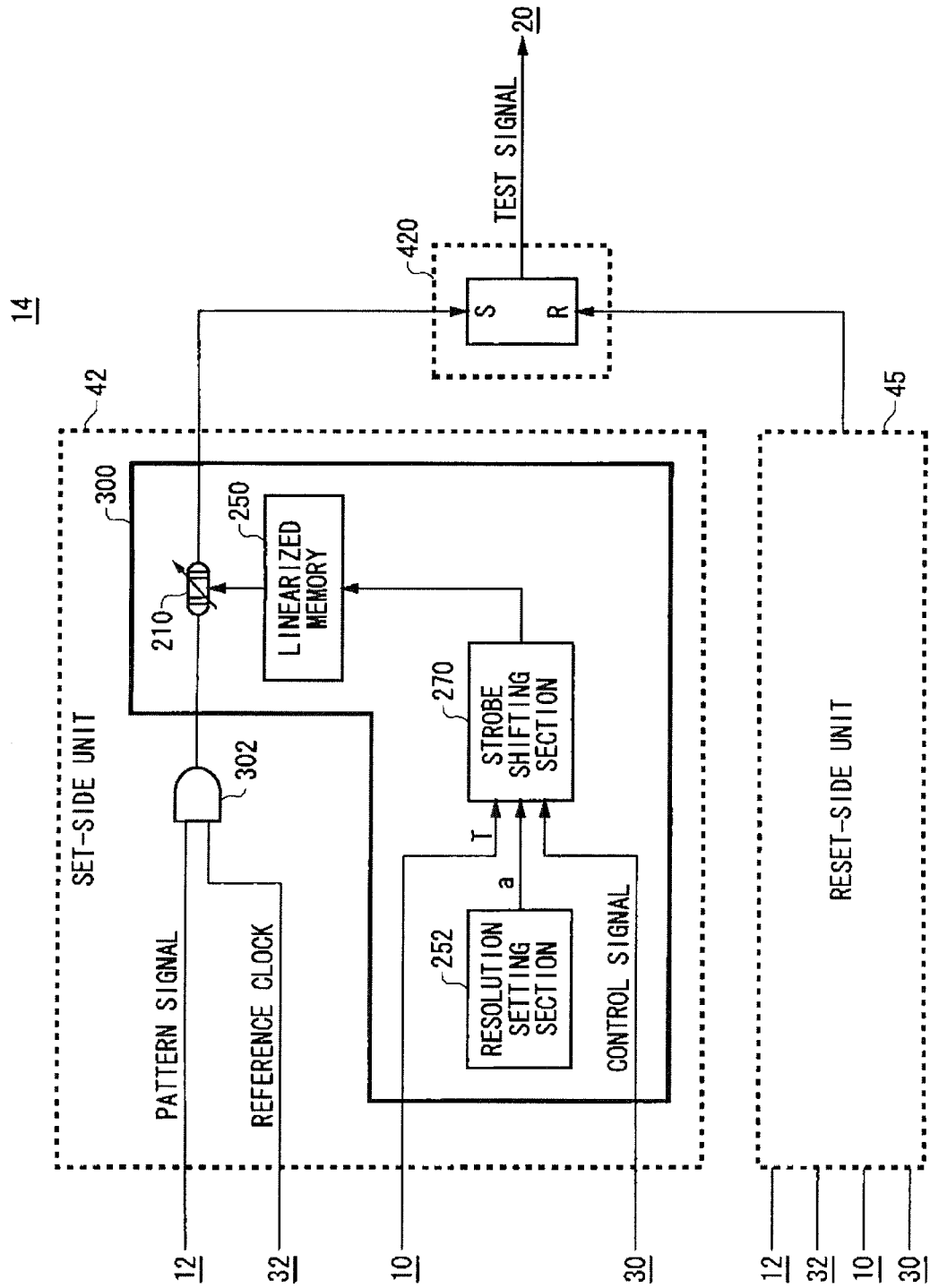
FIG. 10 is a view exemplary showing a configuration of a waveform shaper 14 shown in FIG. 7.

FIG. 10 is a view exemplary showing a configuration of the waveform shaper 14 shown in FIG. 7. The waveform shaper 14 in the present example has a driver timing generating section 300 in place of the delaying section 410 and the delay element 405 in a configuration of the waveform shaper 14 shown in FIG. 4. As described above, the driver timing generating section 300 controls a timing at which the driver section 560 outputs a test signal to a driver timing having a relative phase set for a rate signal.

The driver timing generating section 300 may have a configuration equal to that of the strobe generating section 200 described with reference to FIG. 9. However, a logical product of a pattern signal and a reference clock is input into the delay element 210. Moreover, an output from the delay element 210 is connected to the test signal supplying section 420. In other words, the delay element 210 corresponds to the delay element 405 shown in FIG. 4.

The driver timing generating section 300 is supplied with the timing signal T showing an initial value of the relative phase for the rate signal, for example, from the timing generator 10. The timing signal T corresponds to the relative phase T3 described in FIG. 8.

The resolution setting section 252 stores the resolution data "a" showing a unit change amount every cycle when sequentially changing a phase of a driver timing every cycle of the rate signal. The timing signal T provided from the timing generator 10 and the resolution data "a" may be previously set by a user. For example, the control section 30 may set them in accordance with a program provided from the user. Moreover, the resolution data "a" set in the first comparator section 550-1, the second comparator section 550-2, and the driver section 560 may be equal to one another.

The strobe shifting section 270 may be equal to the strobe shifting section 270 described in FIG. 9 or FIG. 10. The control section 30 provides a High-logic control signal to the AND circuit 254 of the strobe shifting section 270 from starting a process for synchronizing operations of the test apparatus 100 and the electronic device 20 to substantially matching phases of the first strobe signal and DQS. Moreover, when detecting that the phases of the first strobe signal and DQS are identical with each other, the logical value of the control signal is changed into Low logic.

The data storing section 258 holds a relative phase (in the present example, a shift amount of a relative phase) of a driver timing when it has been detected that the phases of the first strobe signal and DQS are identical with each other by changing the logical value of the control signal into Low logic. By such a control, it is possible to perform operations described in FIG. 8. The control section 30 may be supplied with a program including instructions that makes the control section 30 execute this process. By such a configuration, since a phase of a strobe signal is shifted in an arbitrary initial phase and arbitrary resolution, each strobe signal and the operating clock DQS can be synchronized with each other.

FIG. 11 is a view exemplary showing an instruction group included in a program given to the control section 30. In addition, the present example shows a part for synchronizing the test apparatus 100 and the electronic device 20 in the program given to the control section 30.

This program includes an empty loop instruction making the test apparatus 100 wait until an operational clock signal output from the electronic device 20 is stable. A loop count may be determined by the user.

Moreover, this program includes a dummy cycle instruction that adapts the execution of the program to a data transmission by a pipeline of the pattern generator 12 after executing the empty loop instruction. Between these, the comparator section 550 compares the phase of the strobe signal and the phase of the output signal. This program may include a compare instruction that makes the comparator section 550 compare phases.

Moreover, this program includes a shift instruction (TM_INC) that shifts relative phases of the first strobe signal, the second strobe signal, and the driver timing. The control section 30 changes setting of each relative phase by executing the shift instruction. Moreover, this program includes a loop instruction (If (!PASS) JMP LP1) that repeats the shift instruction until the phases of DQS and the first strobe signal are substantially identical with each other.

For example, the control section 30 may execute the loop instruction until the phases of DQS and the first strobe signal are substantially identical with each other in order to perform an operation outputting High logic as a control signal shown in FIG. 9. By executing such a program, it is possible to synchronize the test apparatus 100 and the electronic device 20.

As apparent from the above descriptions, according to an embodiment of the present invention, although on-resistance of a FET switch is increased in order to perform a test using a high-frequency signal, it is possible to reduce degradation of voltage comparison precision of a comparator by fluctuation of this on-resistance.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

What is claimed is:

1. A test apparatus that tests a device under test, comprising:
   a period generator that generates a rate signal determining a test period according to an operating period of the device under test;
   a phase comparing section that inputs an operational clock signal for the device under test generated from the device under test and detects a phase difference between the operational clock signal and the rate signal using the rate signal as a standard;
   a test signal generating section that generates a test signal to be supplied to the device under test in synchronization with the rate signal;
   a delaying section that delays the test signal in accordance with the phase difference to substantially synchronize the delayed signal with the operational clock signal; and
   a test signal supplying section that supplies the delayed test signal to the device under test.

2. The test apparatus as claimed in claim 1, wherein the phase comparing section comprises:
   a strobe generating section that generates strobe signals while sequentially changing a phase for the rate signal;
   a timing comparator that acquires the operational clock signal at a timing designated by each of the strobe signals;
   an edge detecting section that detects an edge of the operational clock signal based on a value of the operational clock signal at each timing; and
   a phase difference output section that outputs the phase difference based on a position of the edge of the operational clock signal for an edge of the rate signal.

3. The test apparatus as claimed in claim 2, wherein
the strobe generating section generates the plurality of strobe signals for each of a first phase and a second phase for the rate signal,
the timing comparator acquires the operational clock signal at the plurality of timings designated by the plurality of strobe signals for each of the first phase and the second phase, and
the edge detecting section detects that the edge of the operational clock signal is between the first phase and the second phase on condition that, in case of the first phase, a ratio that the operational clock signal is a first logical value is not more than a ratio that the operational clock signal is a second logical value and, in case of the second phase, the ratio that the operational clock signal is the first logical value is not less than the ratio that the operational clock signal is the second logical value.

4. The test apparatus as claimed in claim 2, wherein
the strobe generating section generates the predetermined number of the strobe signals for each of the first phase and the second phase for the rate signal,
the timing comparator acquires the operational clock signal at the plurality of timings designated by each of the strobe signals for each of the first phase and the second phase,
the phase comparing section further comprises a count section that counts the number of times by which the operational clock signal has been a predetermined logical value for each of the first phase and the second phase, and
the edge detecting section detects that the edge of the operational clock signal is between the first phase and the second phase on condition that, in case of the first phase, the counted number of times is not more than a preset threshold value and, in case of the second phase, the counted number of times is not less than the threshold value.

5. The test apparatus as claimed in claim 4, wherein
the strobe generating section generates the predetermined number of the strobe signals for each of the phases while sequentially increasing or decreasing the phase, and
the edge detecting section detects that the edge of the operational clock signal is at a position substantially equal to that of the one phase according to the fact that the number of times counted by the count section for the one phase is not less than the threshold value.

6. The test apparatus as claimed in claim 2, wherein
the strobe generating section further comprises:
a modulation memory that stores an amount of modulation of the phase for the rate signal; and
an address register that outputs an address to be provided to the modulation memory, and
the strobe generating section generates the strobe signal by which a phase for the rate signal is determined based on the modulation amount read from the modulation memory according to sequentially incrementing or decrementing the address.

7. The test apparatus as claimed in claim 2, wherein the phase difference output section includes a register that stores phase difference information showing the phase difference.

8. The test apparatus as claimed in claim 7, wherein
the test apparatus further comprises a control section that controls a test for the device under test by the test apparatus,
the phase difference output section informs the control section that the phase difference has been detected when detecting the phase difference, and
the control section reads, in accordance with the notice of detection of the phase difference, the phase difference information stored on the register to set a delay amount of the delaying section and instructs the test signal generating section to generate the test signal for testing the device under test.

9. The test apparatus as claimed in claim 1, wherein the test signal generating section starts generating the test signal for testing the device under test on condition that the phase difference has been detected by the phase comparing section.

10. The test apparatus as claimed in claim 1, wherein
the test apparatus further comprises:
a modulation memory that records a plurality of modulation amounts for the test signal;
an address register that designates an address of the modulation memory; and
a control section that sequentially changes an address value of the address register to make the modulation memory sequentially output the different modulation amounts, and
the delaying section adds or subtracts the modulation amount output from the modulation memory to or from the delay amount set in accordance with the phase difference in order to modulate the test signal.

11. A test method for testing a device under test, comprising:
generating a rate signal determining a test period according to an operating period of the device under test;
inputting an operational clock signal for the device under test generated from the device under test and detecting a phase difference between the operational clock signal and the rate signal using the rate signal as a standard;
generating a test signal to be supplied to the device under test in synchronization with the rate signal;
delaying the test signal in accordance with the phase difference to substantially synchronize the delayed signal with the operational clock signal; and
supplying the delayed test signal to the device under test.

12. A non-transitory computer-readable medium containing instructions that, when executed by a processor, cause a test apparatus that tests a device under test function as:
a period generator that generates a rate signal determining a test period according to an operating period of the device under test;
a phase comparing section that inputs an operational clock signal for the device under test generated from the device under test and detects a phase difference between the operational clock signal and the rate signal using the rate signal as a standard;
a test signal generating section that generates a test signal to be supplied to the device under test in synchronization with the rate signal;
a delaying section that delays the test signal in accordance with the phase difference to substantially synchronize the delayed signal with the operational clock signal; and
a test signal supplying section that supplies the delayed test signal to the device under test.

13. A test apparatus that tests a device under test, comprising:
a period generator that generates a rate signal determining a test period according to an operating period of the device under test;
a strobe generating section that generates a strobe signal having a relative phase set for the rate signal;
a timing comparator that compares a phase of an output signal output from the device under test and a phase of the strobe signal;

a driver section that generates a test signal to be supplied to the device under test to supply the test signal to the device under test;
a driver timing generating section that controls a timing at which the driver section outputs the test signal to a driver timing having the relative phase set for the rate signal; and
a control section that sequentially changes setting of a relative phase of the strobe signal for the rate signal and sequentially changes setting of a relative phase of the driver timing for the rate signal with the generally same change amount, until the timing comparator detects that the phase of the output signal and the phase of the strobe signal are substantially identical with each other.

14. The test apparatus as claimed in claim 13, wherein
the timing comparator receives an operational clock signal of the device under test generated from the device under test as the output signal, and
the control section sequentially changes, before supplying the test signal to the device under test, settings of the relative phases of the strobe signal and the driver timing in order to make the strobe generating section and the driver timing generating section hold the set relative phases when the phase of the operational clock signal and the phase of the strobe signal are substantially identical with each other.

15. The test apparatus as claimed in claim 13, wherein
the test apparatus further comprises:
a first of the timing comparator that receives an operational clock signal of the device under test generated from the device under test as the output signal;
a first of the strobe generating section that supplies a first of the strobe signal to the first timing comparator;
a second of the timing comparator that receives a data signal output from the device under test in accordance with the test signal as the output signal; and
a second of the strobe generating section that supplies a second of the strobe signal to the second timing comparator, and
the control section sequentially changes setting of a relative phase of the first strobe signal for the rate signal and sequentially changes settings of relative phases of the second strobe signal and the driver timing for the rate signal with the generally same change amount as that of the first strobe signal, until the first timing comparator detects that the phase of the operational clock signal and the phase of the first strobe signal are substantially identical with each other.

16. The test apparatus as claimed in claim 13, wherein
the control section executes a program comprising:
a shift instruction for sequentially shifting the settings of the relative phases of the strobe signal and the driver timing; and
a loop instruction for repeating the shift instruction until the phase of the output signal and the phase of the strobe signal are substantially identical with each other.

17. The test apparatus as claimed in claim 13, wherein
the timing comparator detects a logical value of the output signal in the phase of the strobe signal, and
the control section decides that the phase of the strobe signal and the phase of the output signal are substantially identical with each other when the logical value of the output signal detected from the timing comparator according to the setting of each relative phase of the strobe signal is changed into a predetermined logical value.

18. A test apparatus that tests a device under test, comprising:
a period generator that generates a rate signal determining a test period according to an operating period of the device under test;
a first strobe generating section that generates a first strobe signal having a relative phase set for the rate signal;
a first timing comparator that compares a phase of an operational clock signal of the device under test generated from the device under test and a phase of the first strobe signal;
a second strobe generating section that generates a second strobe signal having a relative phase set for the rate signal;
a second timing comparator that compares a phase of a data signal output from the device under test in accordance with a test signal to be input and a phase of the second strobe signal; and
a control section that sequentially changes setting of a relative phase of the first strobe signal for the rate signal and sequentially changes setting of a relative phase of the second strobe signal for the rate signal with the generally same change amount, until the first timing comparator detects that the phase of the operational clock signal and the phase of the first strobe signal are substantially identical with each other.

19. A non-transitory computer-readable medium containing instructions that, when executed by a processor, cause a test apparatus that tests a device under test function as:
a period generator that generates a rate signal determining a test period according to an operating period of the device under test;
a strobe generating section that generates a strobe signal having a relative phase set for the rate signal;
a timing comparator that compares a phase of an output signal output from the device under test and a phase of the strobe signal;
a driver section that generates a test signal to be supplied to the device under test to supply the test signal to the device under test;
a driver timing generating section that controls a timing at which the driver section outputs the test signal to a driver timing having the relative phase set for the rate signal; and
a control section that sequentially changes setting of a relative phase of the strobe signal for the rate signal and sequentially changes setting of a relative phase of the driver timing for the rate signal with the generally same change amount, until the timing comparator detects that the phase of the output signal and the phase of the strobe signal are substantially identical with each other.

20. A non-transitory computer-readable medium containing instructions that, when executed by a processor, cause a test apparatus that tests a device under test function as:
a period generator that generates a rate signal determining a test period according to an operating period of the device under test;
a first strobe generating section that generates a first strobe signal having a relative phase set for the rate signal;
a first timing comparator that compares a phase of an operational clock signal of the device under test generated from the device under test and a phase of the first strobe signal;
a second strobe generating section that generates a second strobe signal having a relative phase set for the rate signal;

a second timing comparator that compares a phase of a data signal output from the device under test in accordance with a test signal to be input and a phase of the second strobe signal; and a control section that sequentially changes setting of a relative phase of the first strobe signal for the rate signal and sequentially changes setting of a relative phase of the second strobe signal for the rate signal with the generally same change amount, until the first timing comparator detects that the phase of the operational clock signal and the phase of the first strobe signal are substantially identical with each other.

* * * * *